US006841318B2

(12) United States Patent
Iwasaki

(10) Patent No.: US 6,841,318 B2
(45) Date of Patent: Jan. 11, 2005

(54) LEVENSON PHASE SHIFT MASK AND METHOD FOR FORMING FINE PATTERN BY USING THE SAME

(75) Inventor: Haruo Iwasaki, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 143 days.

(21) Appl. No.: 10/277,512

(22) Filed: Oct. 22, 2002

(65) Prior Publication Data

US 2003/0096177 A1 May 22, 2003

(30) Foreign Application Priority Data

Nov. 16, 2001 (JP) .................................. 2001-351366

(51) Int. Cl.$^7$ .............................................. G03F 9/00
(52) U.S. Cl. .................................................. 430/5
(58) Field of Search ............... 430/5, 394; 716/19, 716/21

(56) References Cited

U.S. PATENT DOCUMENTS 6,721,938 B2 * 4/2004 Pierrat et al. ................ 716/19

FOREIGN PATENT DOCUMENTS

JP 7-226362 8/1995

* cited by examiner

Primary Examiner—S. Rosasco
(74) Attorney, Agent, or Firm—Katten Muchin Zavis Rosenman

(57) ABSTRACT

Levenson masks capable of minimizing the effect of optical proximity, and a method for forming a fine pattern using such Levenson masks wherein the Levenson masks have patterns where shielding regions are sandwiched between shifter regions and non-shifter regions respectively. The shifter regions and the non-shifter regions are formed to have predetermined shapes to minimize the effect of optical proximity. Specifically, aperture widths, which are defined as widths of the shifter regions and widths of the non-shifter regions perpendicular to the longitudinal directions of the linear shielding regions, are of a predetermined width for minimizing the effect of optical proximity. The Levenson masks have patterns different from each other and are used for multiple exposures.

13 Claims, 7 Drawing Sheets

LEVENSON PHASE SHIFT MASK AND METHOD FOR FORMING FINE PATTERN BY USING THE SAME

FIELD OF THE INVENTION

The present invention relates to a Levenson phase shift mask used for fine fabrication in the field of semiconductor production and the like, and to a method for forming a fine pattern by using the Levenson phase shift mask. Hereinafter, the Levenson phase shift mask is simply referred to as a "Levenson mask".

BACKGROUND OF THE INVENTION

Recently, Levenson masks have become popular as photomasks suitable for ultra-fine fabrication. FIGS. 7A to 7D are plan views showing a conventional Levenson mask and a method for forming a fine pattern using this Levenson mask. Hereinafter, the conventional Levenson mask and the method using the same will be described with reference to these drawings. In the drawings of the present application, circuit patterns, photoresist patterns and shielding regions are shown with oblique lines, shifter regions are shown with dots and non-shifter regions are shown in white.

A conventional Levenson mask 80 shown in FIG. 7B has a pattern in which shielding regions 811–814 are sandwiched by shifter regions 821–823 and non-shifter regions 831–833, respectively. Light transmitting through the shifter regions 821–823 has opposite phase to that of the light transmitting through the non-shifter regions 831–833. Accordingly, these lights interface with each other at the back of the shielding regions 811–814, thereby enhancing fabrication accuracy of the shielding regions 811–814.

FIG. 7A is a plan view showing a circuit pattern (design pattern) 84 of a gate of a transistor. FIG. 7C is a plan view showing a general mask 85 for trimming. FIG. 7D is a plan view showing a photoresist pattern 86 after exposure and development. Hereinafter, a method for forming a fine pattern by using the Levenson mask 80 will be described.

First, the same photoresist film (not shown) is exposed to light using the Levenson mask 80 to form the finest pattern, i.e., the gate pattern, and then exposed using the general mask 85 to form other patterns accompanying the gate. Subsequent development of the exposed photoresist film gives the photoresist pattern 86 where exposed regions of the photoresist film have been removed.

However, the conventional Levenson mask 80 has a drawback of poor fabrication accuracy due to the effect of optical proximity. Optical proximity refers to a phenomenon where the photoresist pattern 86 does not accurately follow the dimensions of the shielding regions 811–814 depending on the patterns of the shifter regions 821–823 and the non-shifter regions 831–833 sandwiching the shielding regions 811–814. For example, a width 87 in the photoresist pattern 86 corresponding to the shielding region 812 is significantly wider than the designed dimensions due to an aperture width 88 of the non-shifter region 832.

SUMMARY OF THE INVENTION

Thus, the present invention has an objective of providing a Levenson mask which can minimize the effect of optical proximity, and a method for forming a fine pattern by using the Levenson mask.

A Levenson phase shift mask according to the present invention has a pattern where a shielding region is sandwiched between a shifter region and a non-shifter region, wherein the shifter region and the non-shifter region are formed to have predetermined shapes for minimizing the effect of optical proximity. For example, aperture widths, which are defined as the width of the shifter region and the width of the non-shifter region perpendicular to the longitudinal direction of the linear shielding region, are of a predetermined width for minimizing the effect of optical proximity, except for an embodiment in which an aperture of a region whose entire pattern is to be formed on a photoresist film may have a different width. Also, a plurality of Levenson phase shift masks having different patterns are used for multiple exposures.

A method for forming a fine pattern by using the Levenson phase shift masks of the present invention, comprises a step of sequentially exposing a same photoresist film using each of the Levenson phase shift masks. Moreover, the method comprises the steps of sequentially exposing a same photoresist film using each of the Levenson phase shift masks, and finally exposing the photoresist film using a general mask for trimming. Furthermore, the photoresist film is used for forming a gate of a transistor and the shielding region corresponds to a gate region.

In other words, the present invention is a method for forming a device pattern by exposure by using Levenson masks and a general mask wherein two Levenson masks are used for forming a fine pattern. Specifically, the fine pattern is divided on two Levenson masks and a total of three masks (two Levenson masks and one general mask) are used for the exposure of the device pattern, thereby minimizing the effect of optical proximity.

When a fine pattern is formed on a single Levenson mask, a space width between the mask patterns will depend on the arrangement of the device pattern. Since the width of the resulting photoresist pattern of the Levenson mask greatly alters depending on the space width between the mask patterns (due to the effect of optical proximity), conventional techniques are not capable of forming a device pattern with high dimension accuracy. On the other hand, according to the present invention, the mask pattern is divided on two Levenson masks so that the space widths can be determined at one's discretion for each of the Levenson masks and thus the dimensions can be controlled. As a result, the effect of optical proximity can be minimized, thereby enhancing control of the dimensions of the device pattern.

BRIEF DESCRIPTION OF THE DRAWINGS

FIG. 1A shows a circuit pattern, FIG. 1B shows a first Levenson mask, FIG. 1C shows a second Levenson mask, FIG. 1D shows a general mask and FIG. 1E shows a photoresist pattern;

FIG. 3A shows a circuit pattern, FIG. 3B shows a first Levenson mask, FIG. 3C shows a second Levenson mask and FIG. 3D shows a general mask;

FIG. 4A shows a circuit pattern, FIG. 4B shows a first Levenson mask, FIG. 4C shows a second Levenson mask and FIG. 4D shows a general mask;

FIG. 7A shows a circuit pattern, FIG. 7B shows a Levenson mask, FIG. 7C shows a general mask and FIG. 7D shows a photoresist pattern.

DETAILED DESCRIPTION OF THE INVENTION

Figure 1:
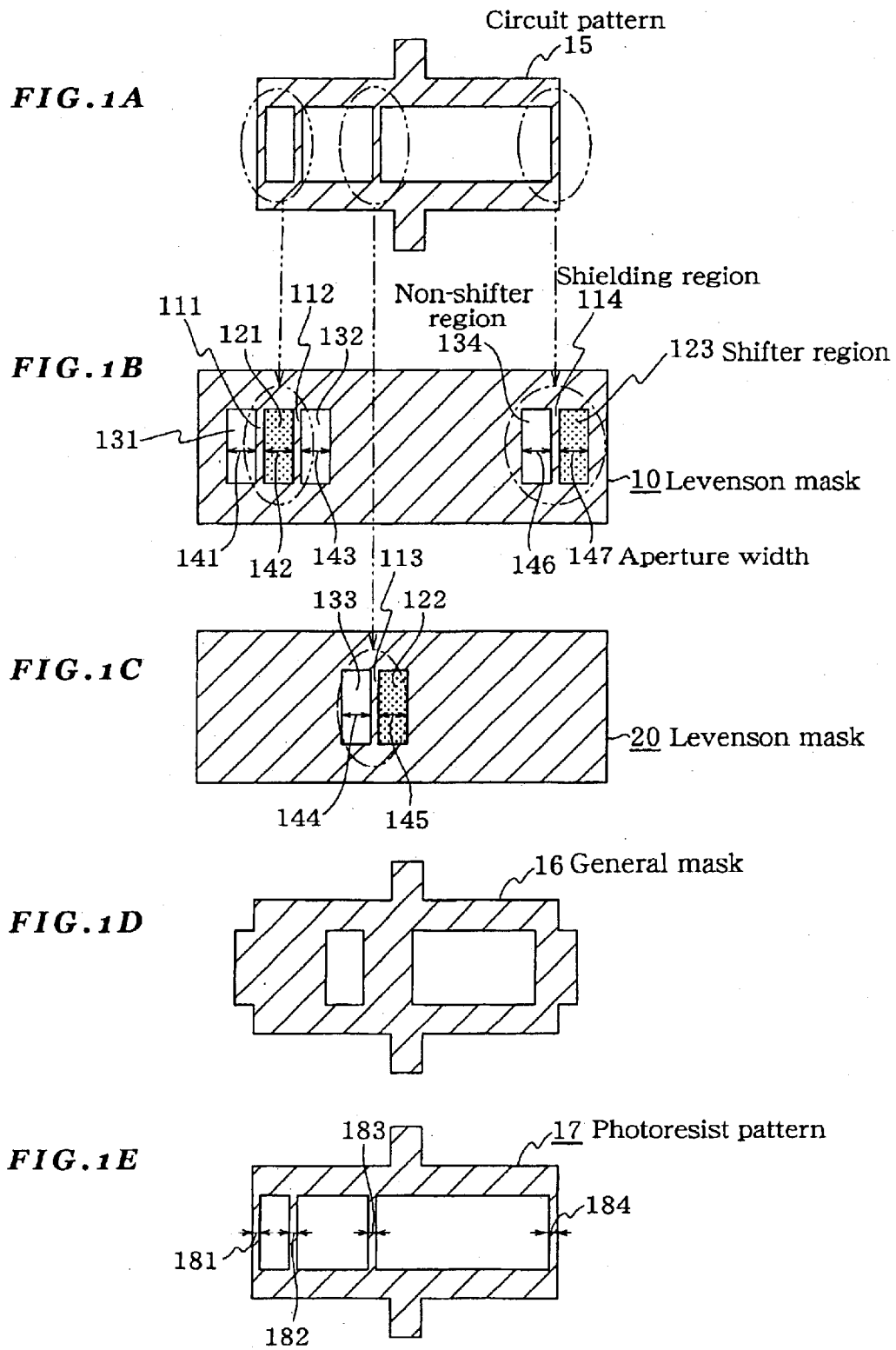
FIGS. 1A to 1E are plan views showing a first embodiment of Levenson masks of the invention and a method for forming a fine pattern by using the Levenson masks, where

FIGS. 1A to 1E are plan views showing a first embodiment of Levenson masks and a method for forming a fine pattern by using these Levenson masks according to the present invention. Hereinafter, the first embodiment will be described with reference to these drawings.

The Levenson masks 10 and 20 according to the present embodiment shown in FIGS. 1B and 1C, respectively, have patterns where shielding regions 111–114 are sandwiched between shifter regions 121–123 and non-shifter regions 131–134, respectively. The shifter regions 121–123 and the non-shifter regions 131–134 are formed to have predetermined shapes to minimize the effect of optical proximity.

Specifically, aperture widths 141–147, which are defined as the widths of the shifter regions 121–123 and the widths of the non-shifter regions 131–134 perpendicular to the longitudinal directions of the linear shielding regions 111–114, are of a predetermined width for minimizing the effect of optical proximity. The Levenson masks 10 and 20 have different patterns and are used for multiple exposures.

FIG. 1A is a plan view showing a circuit pattern (design pattern) 15 of a gate of a transistor. FIG. 1D is a plan view showing a general mask 16 for trimming. FIG. 1E is a plan view showing a photoresist pattern 17 after exposure and development. Hereinafter, a method for forming a fine pattern by using the Levenson masks 10 and 20 will be described.

First, a same photoresist film (not shown) is exposed using the Levenson mask 10 to form a part of the finest pattern, i.e., a part of the gate, and then using the Levenson mask 20 to form the rest of the finest pattern, i.e., the rest of the gate. Finally, the film is exposed to light using the general mask 16 to form other patterns accompanying the gate. Subsequent development of the exposed photoresist film results in the photoresist pattern 17 where the exposed regions of the photoresist film have been removed.

Conventionally, the patterns of the Levenson masks 10 and 20 are formed on a single Levenson mask. As a result, the aperture widths of the non-shifter regions 132 and 133 become wider as they tend to join together. Therefore, fabrication accuracy of the shielding region 112 is deteriorated due to the effect of optical proximity. On the other hand, according to the present embodiment, the non-shifter region 132 is provided on the Levenson mask 10 while the non-shifter region 133 is provided on the Levenson mask 20 so that all of the aperture widths 141–147 can have predetermined widths that are not affected by the effect of optical proximity. As a result, the widths 181–184 of the photoresist pattern 17 corresponding to the shielding regions 111–114 follow the designed dimensions without being affected by the aperture widths 141–147.

Figure 2:
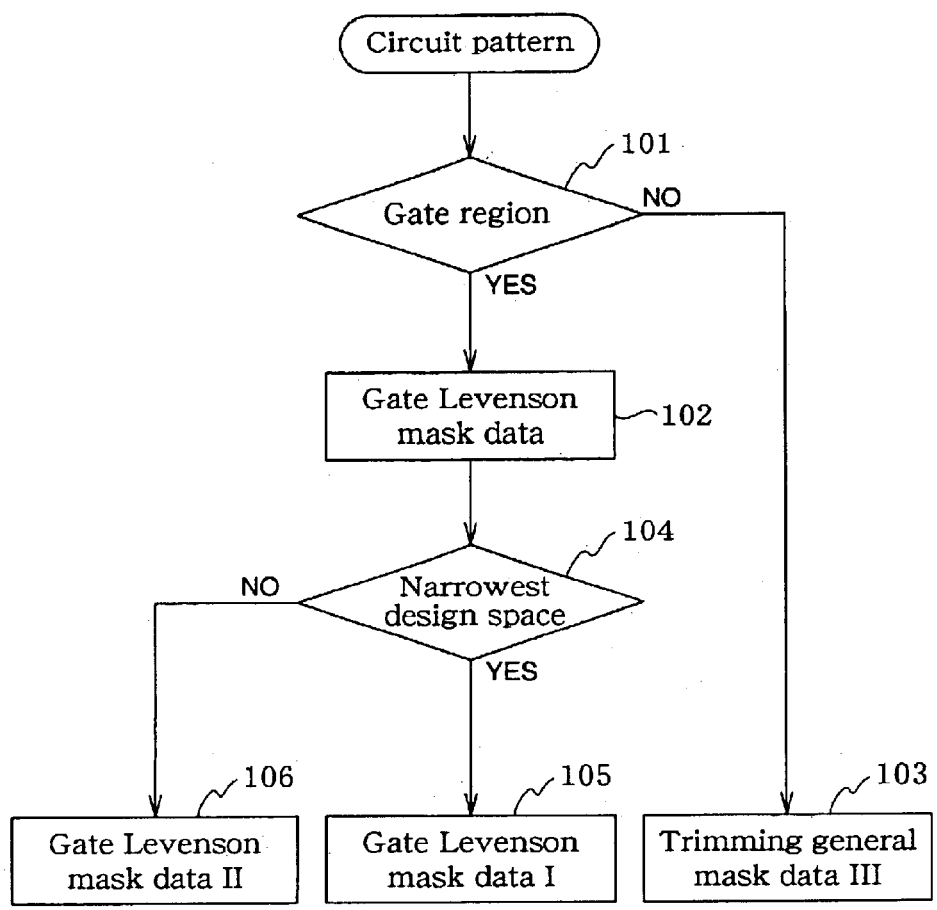
FIG. 2 is a flowchart illustrating a method for designing the Levenson masks and the general masks shown in FIGS. 1B to 1D.

FIG. 2 is a flowchart showing a method for designing the Levenson masks 10 and 20 and the general mask 16.

Hereinafter, this method will be described with reference to FIGS. 1 and 2. The term "space" as used herein refers to regions between the lines of the circuit pattern, i.e., regions other than the lines.

First, since the gate region of the circuit pattern 15 has the finest pattern, it is selected as data for the Levenson masks (Steps 101, 102). The rest of the pattern other than the gate is selected as trimming general mask data III for a general mask 16 (Steps 101, 103). The patterns of the Levenson mask data with the narrowest space are determined as gate Levenson mask data I for the Levenson mask 10 (Steps 104, 105). The patterns with spaces wider than the narrowest space are determined as gate Levenson mask data II which is divided on the Levenson masks 10 and 20 (Steps 104, 106).

FIGS. 3A to 3D are plan views showing a second embodiment of Levenson masks according to the present invention. Hereinafter, this embodiment will be described with these drawings.

Figure 3A:
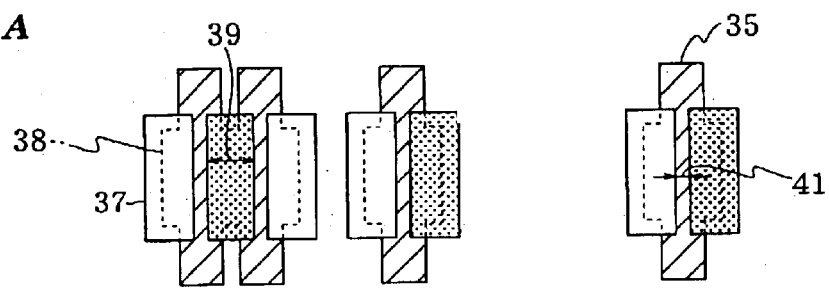
FIGS. 3A to 3D are plan views showing a second embodiment of Levenson masks of the invention, where
Figure 3B:
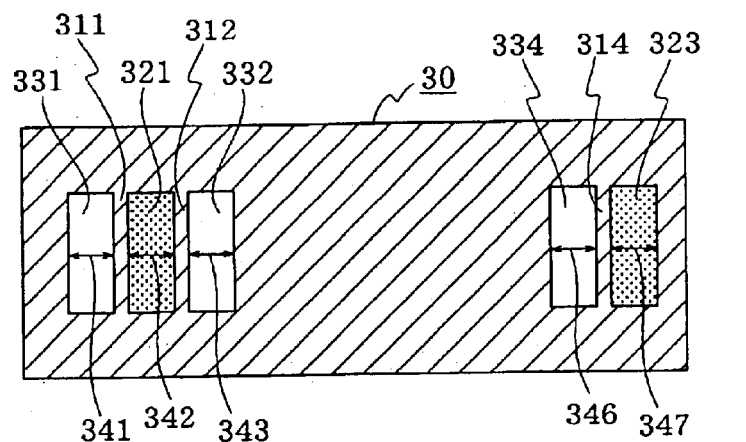
Figure 3C:
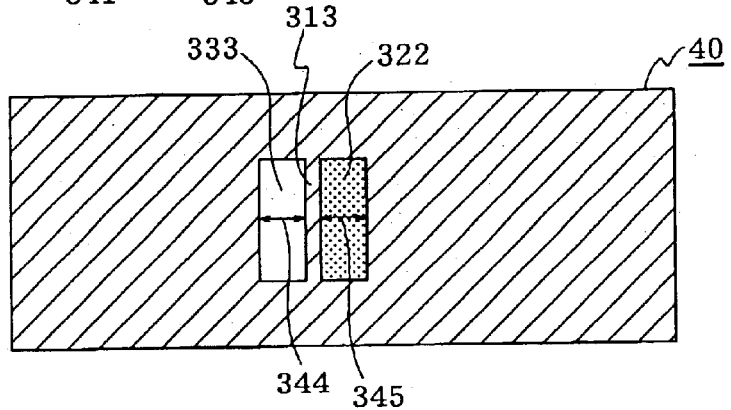

The Levenson masks 30 and 40 of the present embodiment shown in FIGS. 3B and 3C, respectively, have patterns where shielding regions 311–314 are sandwiched between shifter regions 321–323 and non-shifter regions 331–334, respectively. The shifter regions 321–323 and the non-shifter regions 331–334 are formed to have predetermined shapes to minimize the effect of optical proximity. Specifically, aperture widths 341–347, which are defined as widths of the shifter regions 321–323 and widths of the non-shifter regions 331–334 perpendicular to the lengths of the linear shielding regions 311–314, are predetermined width (0.15 $\mu$m) for minimizing the effect of optical proximity. The Levenson masks 30 and 40 have different patterns and are used for multiple exposures.

Figure 3D:
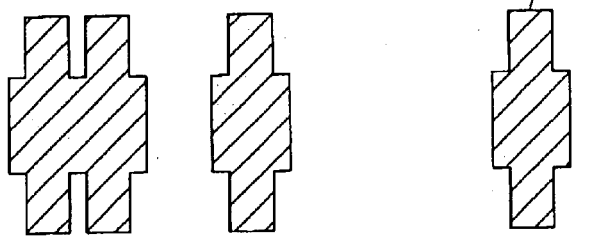

FIG. 3A is a plan view showing a circuit pattern (design pattern) 35 of a gate of a transistor. FIG. 3D is a plan view showing a general mask 36 for trimming. In FIG. 3A, regions enclosed by solid lines represent Levenson mask data 37 while regions enclosed by dashed lines represent general mask data 38. The narrowest design space 39 and the gate width 41 are 0.15 $\mu$m and 0.1 $\mu$m, respectively. The pattern having the narrowest designed space 39 is formed on the Levenson mask 30 while the pattern with spaces other than the narrowest designed space 39 is formed separately on the Levenson masks 30 and 40.

FIGS. 4A to 4D are plan views showing a third embodiment of Levenson masks according to the present invention. Hereinafter, this embodiment will be described with reference to these drawings.

Figure 4A:
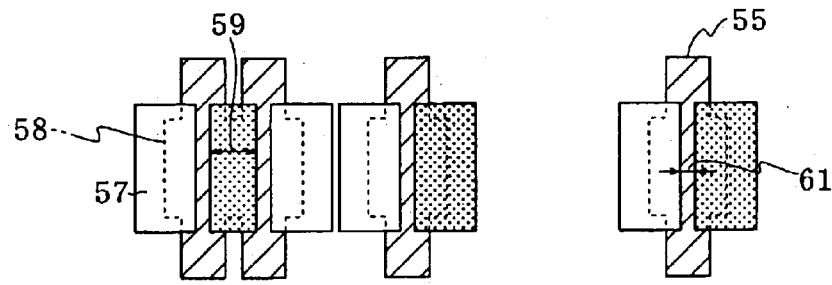
FIGS. 4A to 4D are plan views showing a third embodiment of Levenson masks of the invention, where
Figure 4B:
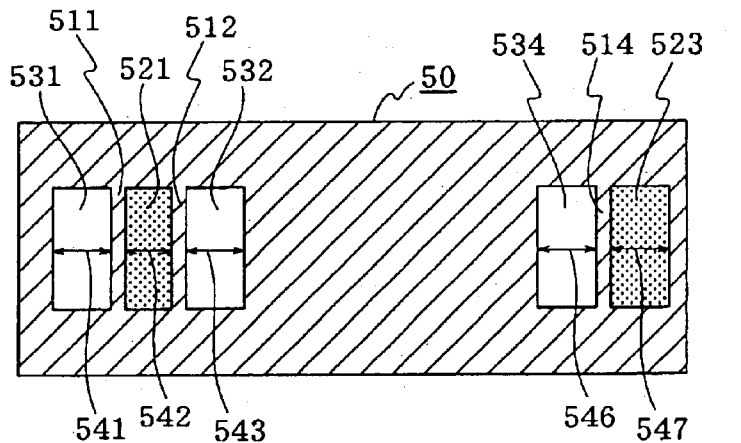
Figure 4C:
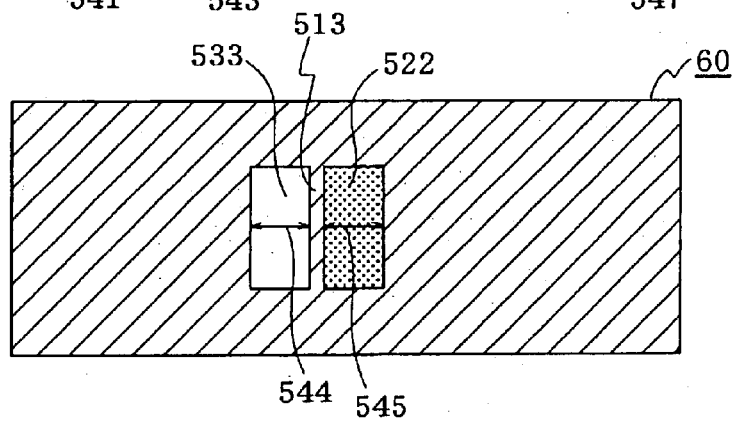

The Levenson masks 50 and 60 of the present embodiment shown in FIGS. 4B and 4C, respectively, have patterns where shielding regions 511–514 are sandwiched between shifter regions 521–523 and non-shifter regions 531–534, respectively. The shifter regions 521–523 and the non-shifter regions 531–534 are formed to have predetermined shapes to minimize the effect of optical proximity. Specifically, aperture widths 541, 543–547 are predetermined width (0.2 $\mu$m) for minimizing the effect of optical proximity. However, the aperture width 542 is 0.15 $\mu$m differing from other widths (0.2 $\mu$m) since its entire pattern is formed on the photoresist film (not shown). The Levenson masks 50 and 60 have different patterns and are used for multiple overlap exposures.

Figure 4D:
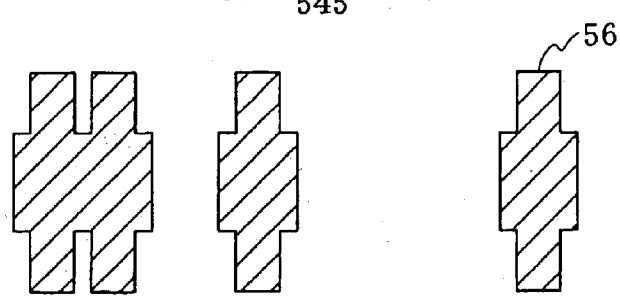

FIG. 4A is a plan view showing a circuit pattern (design pattern) 55 of a gate of a transistor. FIG. 4D is a plan view showing a general mask 56 for trimming. In FIG. 4A, regions enclosed by solid lines represent Levenson mask data 57 while regions enclosed by dashed lines represent general mask data 58. The narrowest design space 59 and the gate width 61 are 0.15 μm and 0.1 μm, respectively. The pattern having the narrowest designed space 59 is formed on the Levenson mask 30 while the pattern with spaces other than the narrowest designed space 59 is formed separately on the Levenson masks 50 and 60.

EXAMPLE

Figure 5:
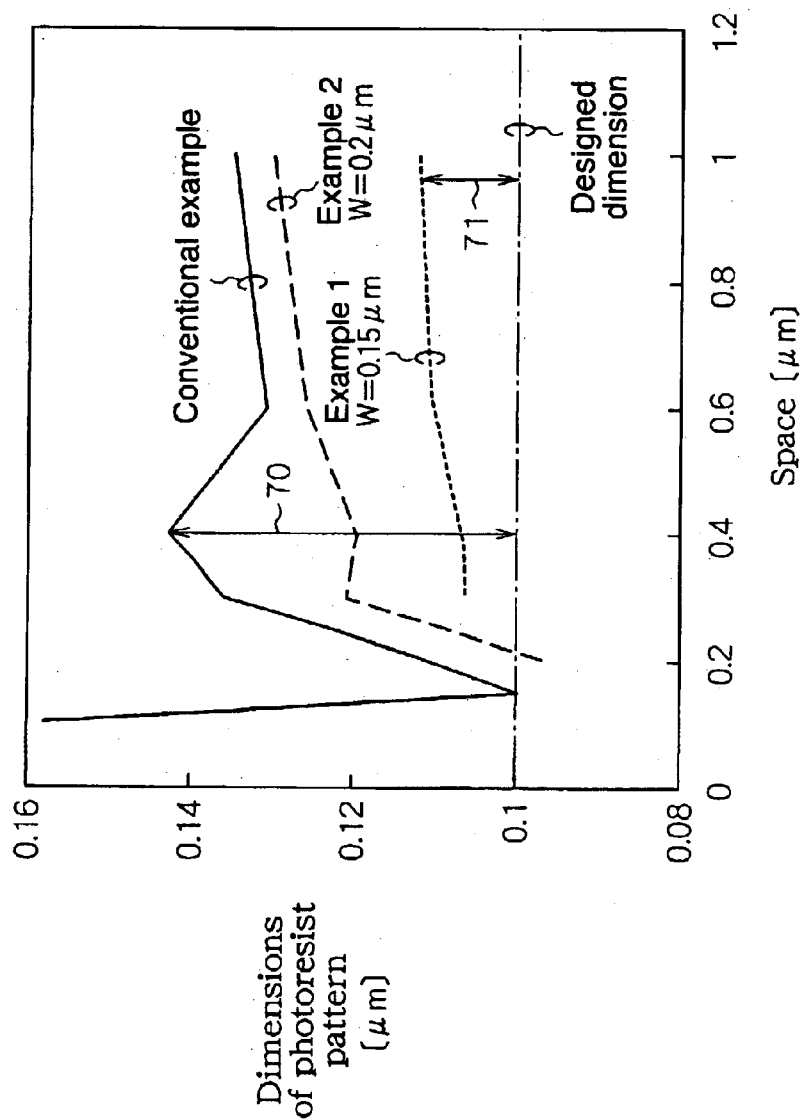
FIG. 5 is a graph for comparing the effect of optical proximity in Conventional example with those in Examples of the invention.

FIG. 5 is a graph for comparing the effect of optical proximity in conventional example with those in Examples 1 and 2 of the invention. Hereinafter, this comparison will be described with reference to this graph.

FIG. 5 shows results of measurement indicating changes in critical dimension of the photoresist patterns according to the spaces between lines, i.e., regions other than the lines. The designed line width was set to 0.1 μm while the space was altered between about 0.2 μm to 1.0 μm. "Conventional example" used a single Levenson mask where all of the spaces are used either as a non-shifter region or a shifter region. "Example 1" used a first Levenson mask where either a non-shifter region or a shifter region (aperture widths W=0.15 μm) is provided at both sides of one of lines sandwiching a space, and a second Levenson mask where either a non-shifter region or a shifter region (aperture widths W=0.15 μm) is provided at both sides of the other one of the lines sandwiching the space. "Example 2" used a first Levenson mask where either a non-shifter region or a shifter region (aperture widths W=0.2 μm) is provided at both sides of one of lines sandwiching a space, and a second Levenson mask where either a non-shifter region or a shifter region (aperture widths W=0.2 μm) is provided at both sides of the other one of the lines sandwiching the space.

As can be appreciated from FIG. 5, a maximum shift 70 of 0.04 μm was caused in the photoresist pattern of the conventional example due to the effect of optical proximity. On the other hand, the effect of optical proximity was minimized in Examples 1 and 2. Particularly in Example 1, photoresist pattern has only a little shift 71 of 0.01 μm at the maximum. Thus, by appropriately controlling the aperture widths of the Levenson masks of the invention, dimensional shift can be minimized to as small as 0.01 μm or less.

Figure 6A:
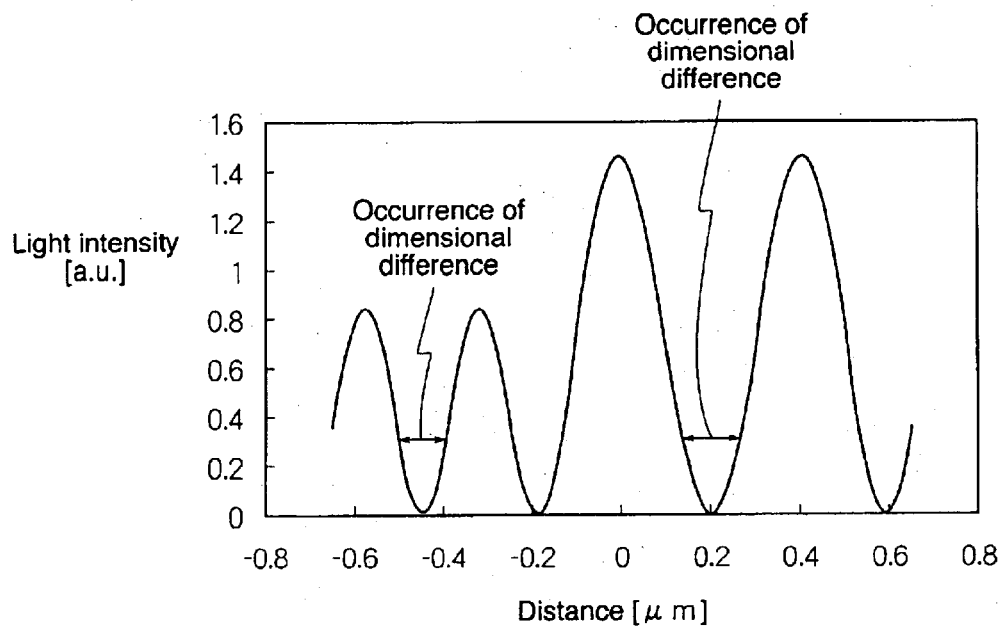
FIGS. 6A and 6B are graphs for comparing light intensity distribution in Conventional example (FIG. 6A) with those in Example of the invention (FIG. 6B)
Figure 6B:
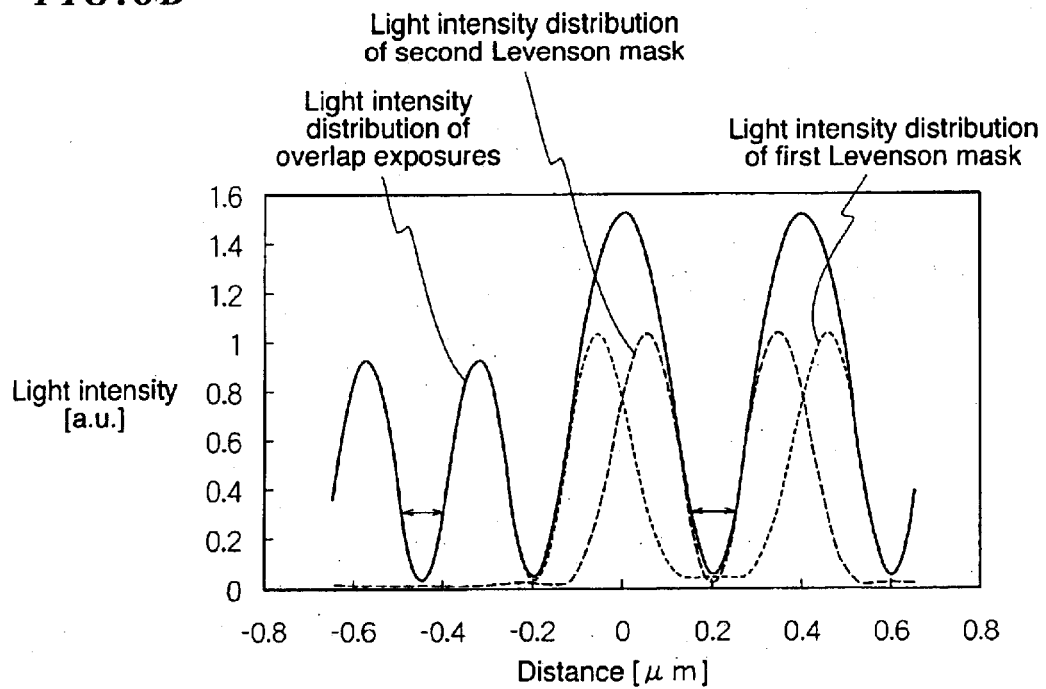
Figure 7A:
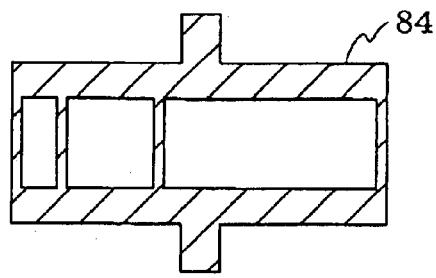
FIGS. 7A to 7D are plan views showing a conventional Levenson mask and a method for forming a fine pattern using this conventional Levenson mask, where
Figure 7B:
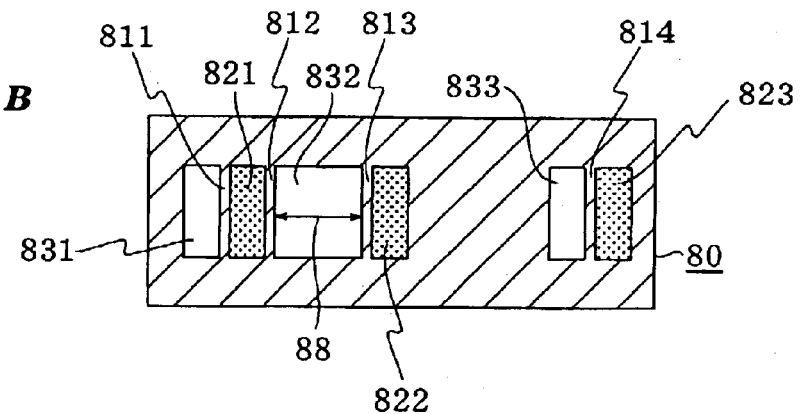
Figure 7C:
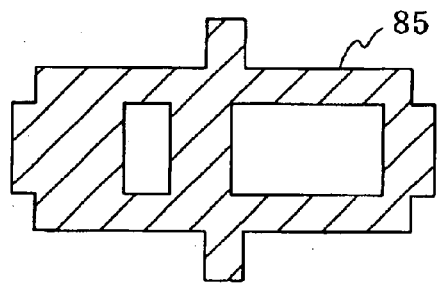
Figure 7D:
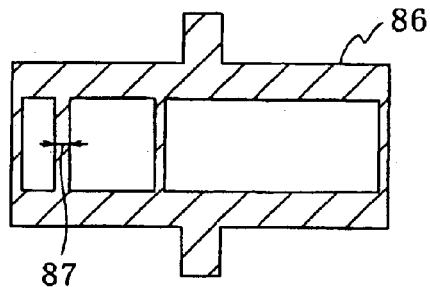

FIGS. 6A and 6B are graphs for comparing light intensity distribution in Conventional example (FIG. 6A) with those in Example of the invention (FIG. 6B). Hereinafter, the comparison will be described with reference to these graphs.

FIGS. 6A and 6B show results of simulation of how the intensity of light passing through the mask pattern changes according to the distance above the photoresist pattern. The X-axis represents the distance above the photoresist pattern with zero at the center. Troughs of the waveform correspond to the lines of the mask pattern and peaks of the waveform correspond to spaces of the mask pattern. "Conventional example" used a single Levenson mask (FIG. 6A). "Example of the invention" used first and second Levenson masks having different mask patterns (FIG. 6B).

Referring to FIG. 6B, the widths of the troughs of the waveform are narrower and steeper as compared to those of Conventional example shown in FIG. 6A. Thus, according to Example of the invention, exposure has been successful even when the apertures are partially overlapped, achieving very high dimensional uniformity as compared to Conventional example.

With Levenson masks of the invention, shifter regions and non-shifter regions are formed to have predetermined shapes that are not affected by the effect of optical proximity, thereby enhancing dimensional accuracy of a photoresist pattern. According to a method for forming a fine pattern of the invention, Levenson masks of the invention are used to eliminate the effect of optical proximity. Thus, a photoresist pattern following the dimensions of the Levenson mask patterns can be formed, thereby enhancing accuracy for fine fabrication.

In other word, since the effect of optical proximity can be minimized by the present invention, controlling the dimensions of the device pattern is improved and thus the device characteristics are improved. According to conventional techniques, only a single Levenson mask is used, which required change in aperture widths of the Levenson mask depending on the spaces between the lines of the circuit pattern. As a result, dimensional accuracy of the photoresist pattern is deteriorated due to the effect of optical proximity. According to the present invention, the conventional signal Levenson mask is replaced with a plurality of Levenson masks so that the aperture widths of the Levenson masks are predetermined width regardless of the spaces between the lines. Accordingly, dimensional accuracy of the photoresist pattern can be enhanced.

What is to be claimed:

1. A Levenson phase shift mask having a pattern where a shielding region is sandwiched between a shifter region and a non-shifter region, wherein the pattern of the shifter region, the shielding region and the non-shifter region is formed separately on a plurality of different Levenson shift masks, and the separate patterns are formed to have predetermined shapes for minimizing the effect of optical proximity.

2. A method for forming a fine pattern by using the Levenson phase shift masks of claim 1, comprising a step of sequentially exposing a same photoresist film using each of the plurality of different Levenson phase shift masks.

3. A method for forming a fine pattern according to claim 2, wherein the photoresist film is used for forming a gate of a transistor and the shielding region corresponds to a gate region.

4. A Levenson phase shift mask according to claim 1, wherein aperture widths defined as the width of the shifter region and the width of the non-shifter region in a direction perpendicular to the longitudinal direction of the elongated shielding region have a predetermined width for minimizing the effect of optical proximity, said predetermined width being 0.15 μm.

5. A Levenson phase shift mask according to claim 1, wherein aperture widths defined as the width of the shifter region and the width of the non-shifter region in a direction perpendicular to the longitudinal direction of the elongated shielding region have a predetermined width for minimizing the effect of optical proximity, said predetermined width being 0.2 μm.

6. A Levenson phase shift mask having a pattern where a linear shielding region is sandwiched between a shifter region and a non-shifter region, wherein aperture widths, which are defined as the width of the shifter region and the width of the non-shifter region perpendicular to the longitudinal direction of the linear shielding region, are of predetermined widths for minimizing the effect of optical proximity, and wherein a plurality of Levenson phase shift masks having different patterns are used for multiple exposures.

7. A Levenson phase shift mask according to claim 6, wherein the aperture widths have a predetermined width for minimizing the effect of optical proximity except an aperture width of a region whose entire pattern is to be formed on a photoresist film.

8. A method for forming a fine pattern by using the Levenson phase shift masks of claim 7, comprising a step of sequentially exposing a same photoresist film using each of the Levenson phase shift masks.

9. A method for forming a fine pattern by using the Levenson phase shift masks of claim 7, comprising the steps of sequentially exposing a same photoresist film using each of the Levenson phase shift masks, and finally exposing the photoresist film using a general mask for trimming.

10. A method for forming a fine pattern according to claim 9, wherein the photoresist film is used for forming a gate of a transistor and the shielding region corresponds to a gate region.

11. A method for forming a fine pattern according to claim 8, wherein the photoresist film is used for forming a gate of a transistor and the shielding region corresponds to a gate region.

12. A method for forming a fine pattern by using the Levenson phase shift masks of claim 6, comprising the steps of sequentially exposing a same photoresist film using each of the Levenson phase shift masks, and finally exposing the photoresist film using a general mask for trimming.

13. A method of forming a fine pattern according to claim 12, wherein the photoresist film is used for forming a gate of a transistor and the shielding region corresponds to a gate region.

* * * * *